United States Patent
Kwon (10) Patent No.: US 7,279,381 B2
(45) Date of Patent: Oct. 9, 2007

(54) METHOD FOR FABRICATING CELL TRANSISTOR OF FLASH MEMORY

(75) Inventor: Young Min Kwon, Incheon (KR)

(73) Assignee: Dongbu Electronics Co., Ltd., Seoul (KR)

( * ) Notice: Subject to any disclaimer, the term of this patent is extended or adjusted under 35 U.S.C. 154(b) by 54 days.

(21) Appl. No.: 11/179,452

(22) Filed: Jul. 12, 2005

(65) Prior Publication Data

US 2006/0008990 A1   Jan. 12, 2006

(30) Foreign Application Priority Data

Jul. 12, 2004   (KR) ...................... 10-2004-0053923

(51) Int. Cl.
*H01L 21/8242* (2006.01)

(52) U.S. Cl. ...................... 438/248; 438/221; 438/296; 438/359

(58) Field of Classification Search ................ 438/248, 438/221, 296, 359
See application file for complete search history.

(56) References Cited

U.S. PATENT DOCUMENTS

| | | | |
|---|---|---|---|
| 6,413,809 B2 * | 7/2002 | Nakamura et al. | 438/201 |
| 2003/0045105 A1 * | 3/2003 | Feldner et al. | 438/689 |
| 2004/0092116 A1 * | 5/2004 | Hsieh | 438/694 |
| 2005/0032322 A1 * | 2/2005 | Kim et al. | 438/301 |
| 2006/0202301 A1 * | 9/2006 | Ohta et al. | 257/510 |

* cited by examiner

*Primary Examiner*—Thao P. Le
(74) *Attorney, Agent, or Firm*—Andrew D. Fortney

(57) ABSTRACT

A method for fabricating a cell transistor of a flash memory including a device isolation film is disclosed, to prevent the mouse bite and the residue of a gate electrode, which includes the steps of forming a moat pattern of STI structure on a semiconductor substrate; forming a shallow trench by etching the semiconductor substrate exposed by the moat pattern; forming a gap-fill insulating layer in the shallow trench by HDP; forming the device isolation film of STI structure in the shallow trench by etching the gap-fill insulating layer with CMP; forming a flash cell pattern for opening an area for flash memory cell transistor in the semiconductor substrate; and removing the flash cell pattern and the moat pattern after etching the upper surface of the device isolation film in the area being opened by the flash cell pattern.

20 Claims, 12 Drawing Sheets

METHOD FOR FABRICATING CELL TRANSISTOR OF FLASH MEMORY

CROSS-REFERENCE TO RELATED APPLICATION

This application claims the benefit of the Korean Patent Application No. 10-2004-0053923, filed on Jul. 12, 2004, the contents of which are hereby incorporated herein by reference in their entirety.

BACKGROUND OF THE INVENTION

1. Field of the Invention

The present invention relates to a method for fabricating a cell transistor of a flash memory, and more particularly, to a method for fabricating a cell transistor of a flash memory to prevent the decrease of yield by removing the residue generated when etching a gate electrode.

2. Discussion of the Related Art

Recently, an EEPROM (Electrically Erasable Programmable Read-Only Memory) type flash memory is widely used for a digital camera, a mobile phone, etc. The EEPROM type flash memory may completely erase data from memory cells, or may erase data from memory cells by each unit sector.

In the EEPROM type flash memory, on a programming mode, a channel hot electron generates at the side of drain, and the channel hot electron is stored in a floating gate, whereby a threshold voltage of a cell transistor increases. In the meantime, on an erasing mode of the EEPROM type flash memory, a high voltage is generated between the floating gate and source/substrate, and the channel hot electron stored in the floating gate is discharged, thereby lowering the threshold voltage of the cell transistor.

Figure 1:
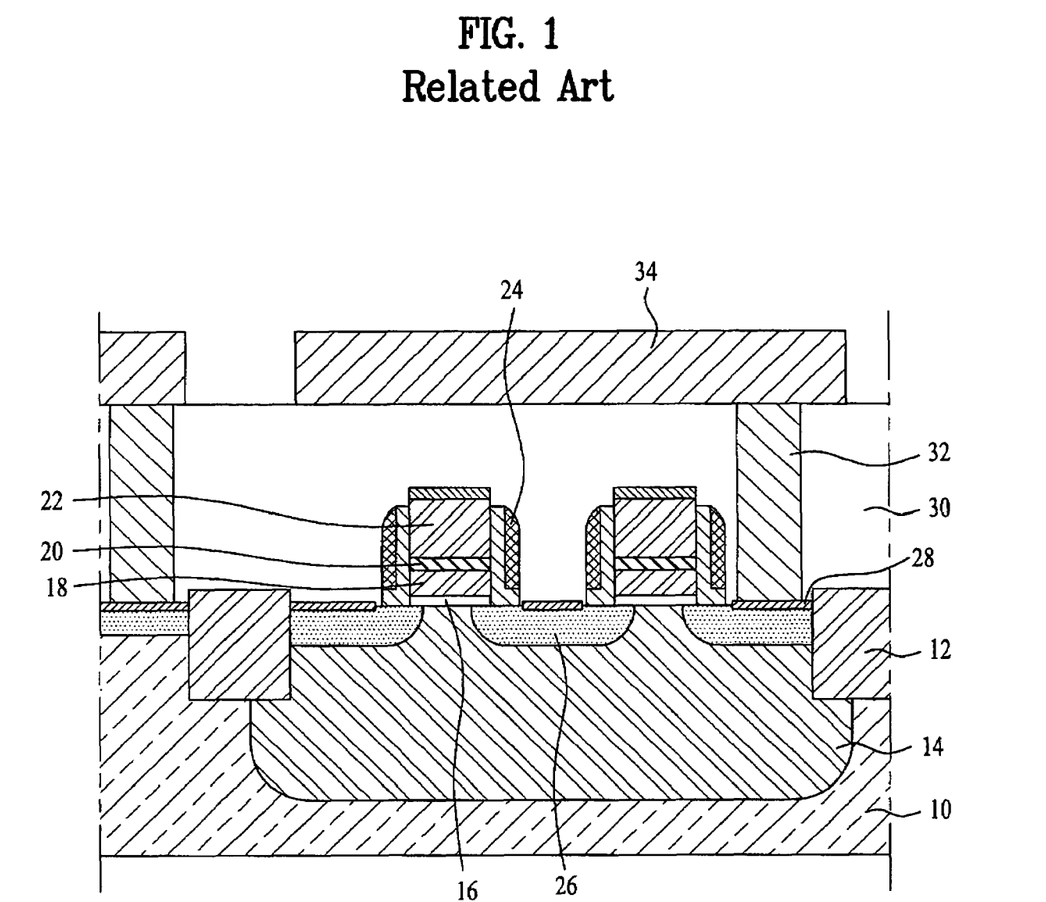
FIG. 1 is a cross sectional view of illustrating a cell transistor in a flash memory according to the related art.

FIG. 1 is a cross sectional view of illustrating a cell transistor of a flash memory according to the related art. Referring to FIG. 1, a cell transistor of a flash memory according to the related art is comprised of a semiconductor substrate 10, a device isolation film 12, a tunnel oxide layer 16, a floating gate 18, a gate insulating layer 20, a control gate 22, and source and drain regions 26. At this time, the semiconductor substrate 10 is formed of a silicon substrate, and the device isolation film 12 of an STI (Shallow Trench Isolation) structure is formed on the semiconductor substrate 10. Then, the tunnel oxide layer 16, the floating gate 18, the gate insulating layer 20 and the control gate 22 are sequentially stacked on the semiconductor substrate 10 in correspondence with the predetermined portion between the device isolation films 12. Also, the source and drain regions 26 are formed in the semiconductor substrate 10 at both sides of the floating gate 18.

In addition, an insulating interlayer 30 is formed on an entire surface of the cell transistor. Also, a contact electrode 32 and a line 34 are connected with the source and drain regions 26 through a contact hole of the insulating interlayer 30.

Next, a well 14 is formed in the semiconductor substrate 10 between the device isolation films 12. Then, spacers 24 are formed at the sidewalls of the control gate 22 and the tunnel oxide layer 16, wherein the spacers are formed of an insulating material. Also, a metal silicide layer 28 of tungsten silicide WSi is formed on the control gate 22 and the source and drain regions 22.

According to the trend toward the high-integration semiconductor device, the device isolation film 12 prefers an STI (Shallow Trench Isolation) structure to an LOCOS (LOCal Oxidation of Silicon) structure. In case the device isolation film is formed in the STI structure, it is possible to decrease the width of the device isolation film.

Figure 2:
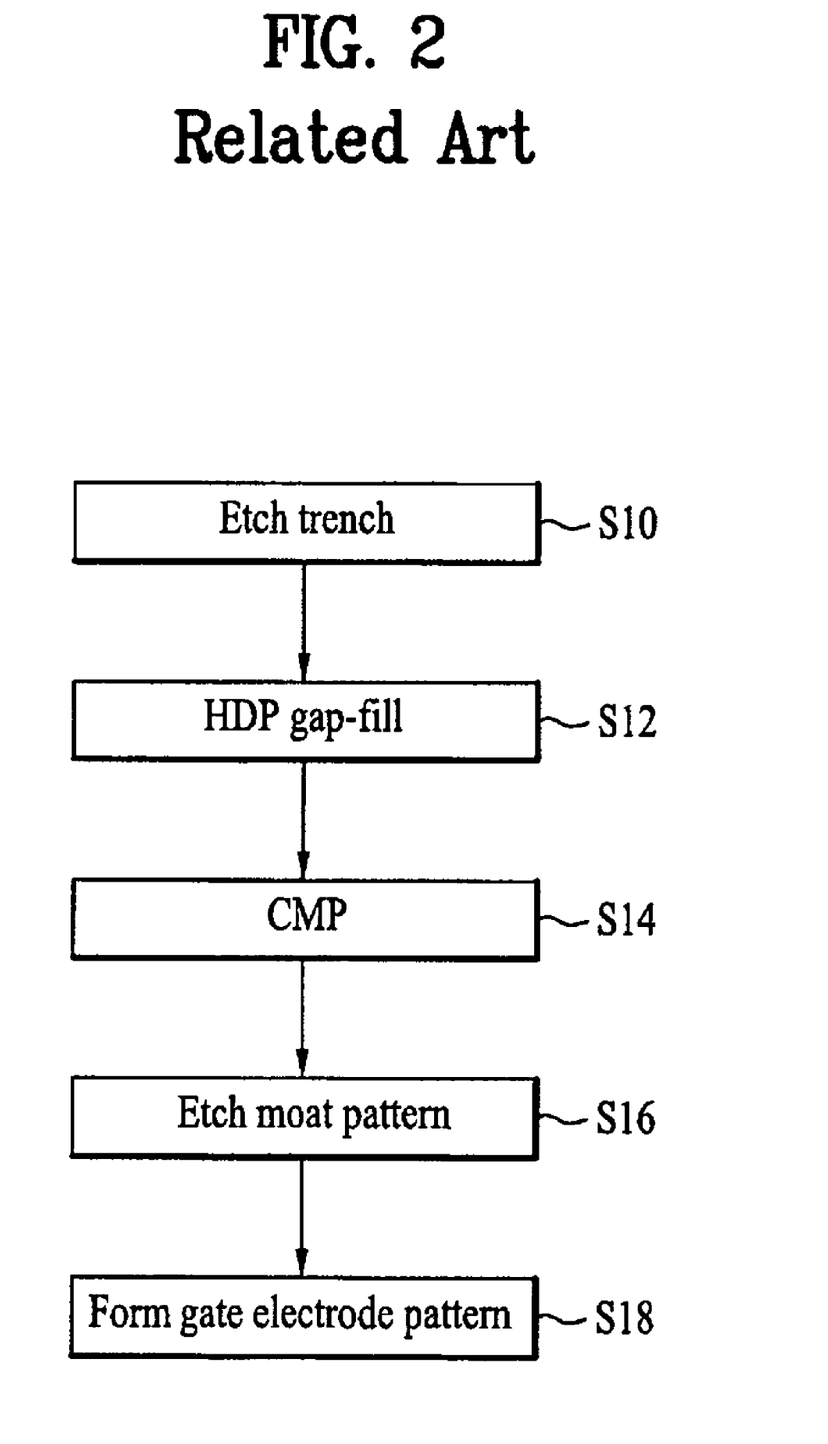
FIG. 2 is a flow chart of illustrating the process for fabricating a device isolation film and a gate in a cell transistor of a flash memory according to the related art.

FIG. 2 is a flow chart of illustrating the process for fabricating the device isolation film and the gates in the cell transistor of the flash memory according to the related art.

FIG. 3A to FIG. 3E are cross sectional views of the process for fabricating the device isolation film and the gates in the cell transistor of the flash memory according to the related art.

The device isolation film 12 of STI structure and the gates 18 and 22 in the cell transistor of the flash memory according to the related art are fabricated in the following process.

Figure 3A:
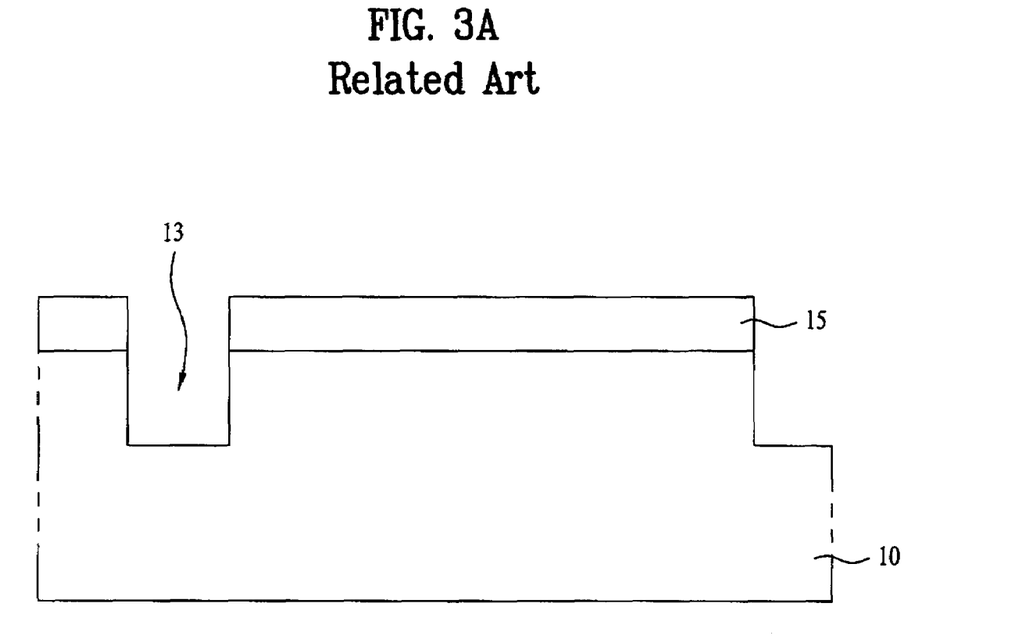
FIG. 3A to FIG. 3E are cross sectional views of the process for fabricating the device isolation film and the gates in the cell transistor of the flash memory according to the related art.

Referring to FIG. 3A, an STI moat pattern 15 is formed in the semiconductor substrate 10. Then, the semiconductor substrate 10 exposed by the STI moat pattern 15 is etched, thereby forming a shallow trench 13 (S10). At this time, the STI moat pattern 15 is formed of a silicon nitride layer $Si_3N_4$. In addition, a silicon oxide layer $SiO_2$ may be additionally formed below the STI moat pattern 15, wherein the silicon oxide layer functions as a pad.

Figure 3B:
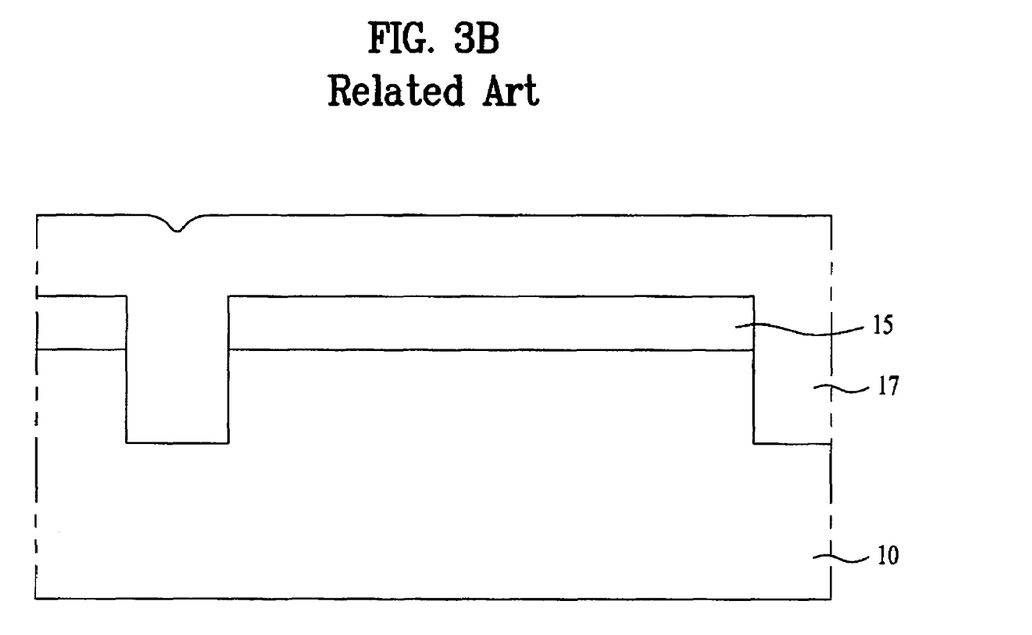

Referring to FIG. 3B, the shallow trench 13 is gap-filled by HDP (High Density Plasma) process, whereby the shallow trench 13 is filled with an insulating layer 17 such as silicon oxide $SiO_2$ or TEOS (Tetraethylorthosilicate).

Figure 3C:
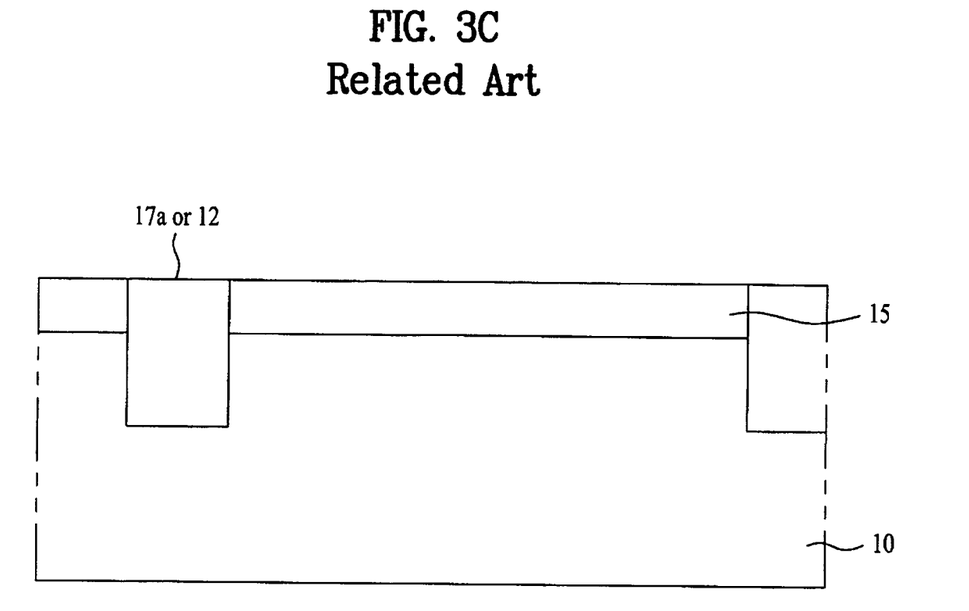

Referring to FIG. 3C, the gap-fill insulating layer 17 is etched by CMP (Chemical Mechanical Polishing) when exposing the STI moat pattern 15, thereby planarizing the surface of the insulating layer.

Figure 3D:
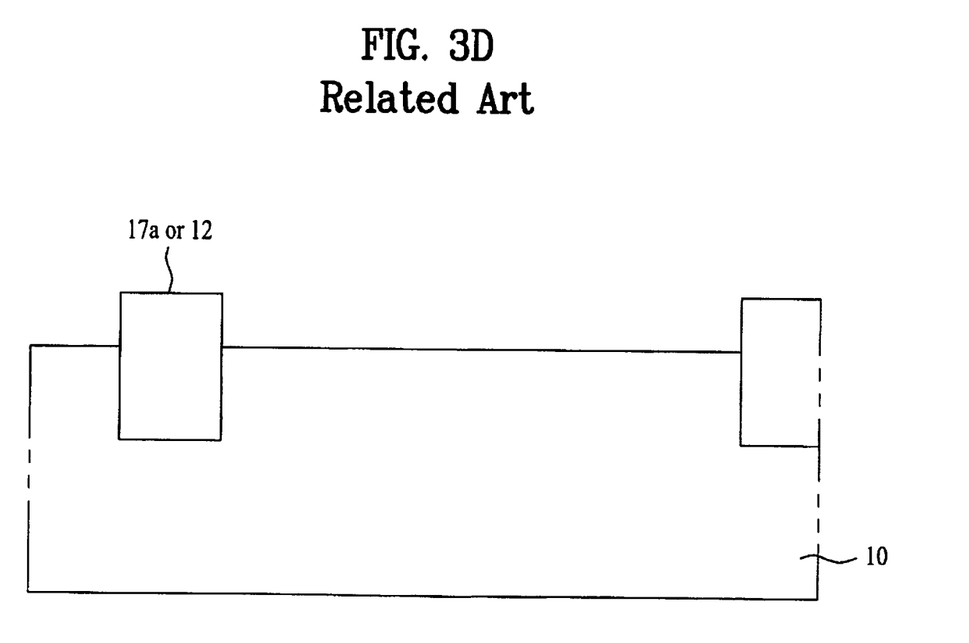

Referring to FIG. 3D, the STI moat pattern 15 is removed with phosphoric acid $H_3PO_4$ (S14 to S16) to form the device isolation films 12.

Figure 3E:
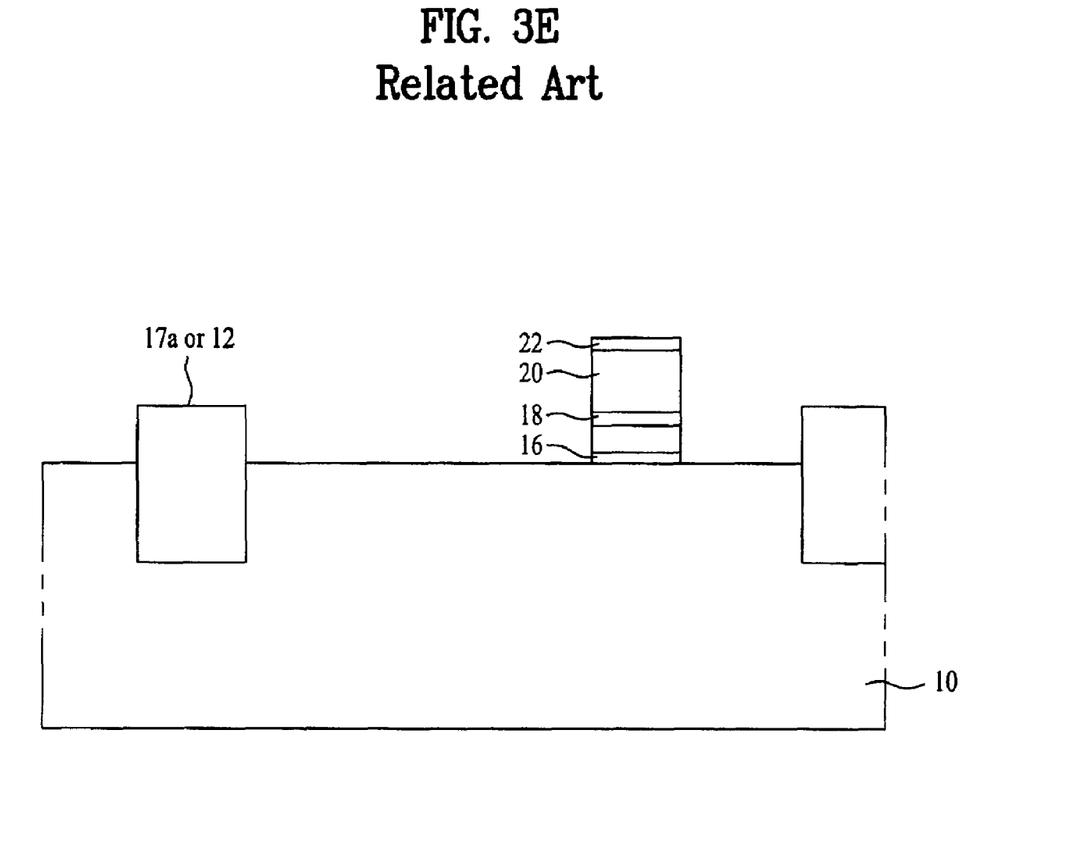

Referring to FIG. 3E, the tunnel oxide layer 16 is formed on the semiconductor substrate 10 in correspondence with the predetermined portion between the device isolation films 12. Thereon, after forming a conductive layer for the floating gate, for example, doped polysilicon, the gate insulating layer of ONO (oxide-nitride-oxide) is formed, and then a conductor layer for the control gate, for example, doped polysilicon, is formed in sequence. Then, the gate electrode of the cell transistor in the flash memory is patterned in a dry-etching method of using a gate mask (S18). That is, the control gate 22 is formed by patterning the upper doped polysilicon, and the gate insulating layer 20 is patterned under the control gate 22. Then, the floating gate 18 is formed by patterning the lower doped polysilicon.

Figure 4:
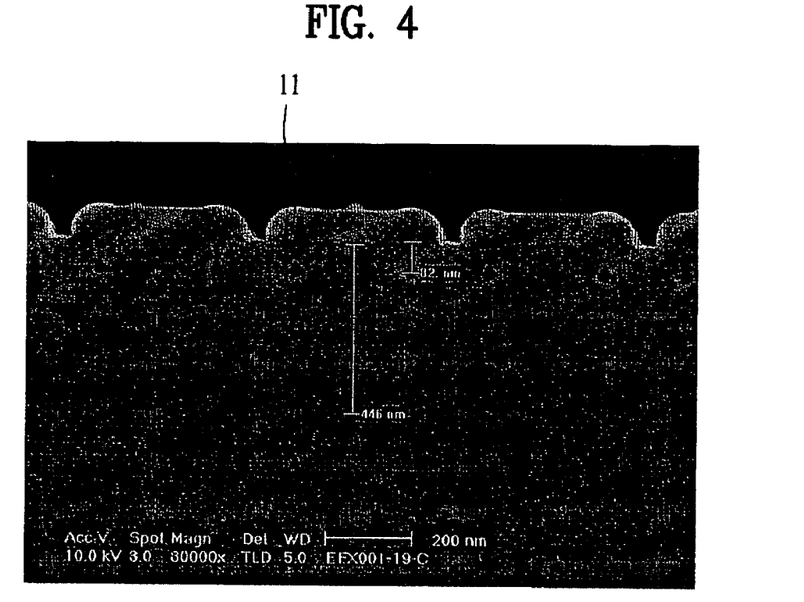
FIG. 4 illustrates the mouse bite generated when fabricating a device isolation film of a cell transistor according to the related art.
Figure 5:
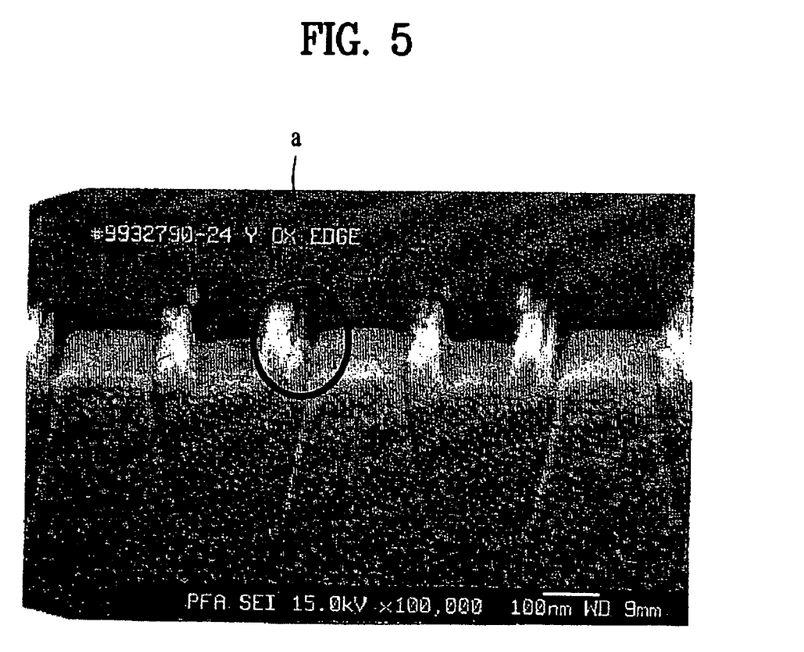
FIG. 5 illustrates the etching residue generated due to the mouse bite when fabricating a cell transistor according to the related art.

If the gap-filling process for the shallow trench is performed by HDP when fabricating the device isolation film according to the related art, the mouse bite 11 may be generated in the upper edge of the shallow trench due to the characteristics of HDP performing the deposition and etching process together, as shown in FIG. 4. On the etching of HDP, there is the layer having the relatively large etching ratio than the remaining portions. Thus, the negative sloping surface is formed in the upper edge of the device isolation film of STI structure. As a result, as shown in FIG. 5, the etching residue (a) of polysilicon remains on the patterning process of the gate electrode due to the negative sloping surface.

SUMMARY OF THE INVENTION

Accordingly, the present invention is directed to a method for fabricating a cell transistor of a flash memory that substantially obviates one or more problems due to limitations and disadvantages of the related art.

An object of the present invention is to provide a method for fabricating a cell transistor of a flash memory to prevent the mouse bite and the residue of a gate electrode by depositing and patterning a gate electrode and etching an STI layer at a constant thickness after performing CMP to a gap-fill insulating layer.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a method for fabricating a cell transistor of a flash memory, the cell transistor having a device isolation film of STI structure, includes the steps of forming a moat pattern of STI structure on a semiconductor substrate; forming a shallow trench by etching the semiconductor substrate exposed by the moat pattern; forming a gap-fill insulating layer in the shallow trench by HDP; forming the device isolation film of STI structure in the shallow trench by etching the gap-fill insulating layer with CMP; forming a flash cell pattern for opening an area for flash memory cell transistor in the semiconductor substrate; and removing the flash cell pattern and the moat pattern after etching the upper surface of the device isolation film in the area being opened by the flash cell pattern.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

Hereinafter, a method for fabricating a cell transistor of a flash memory according to the present invention will be described with reference to the accompanying drawings.

Figure 6:
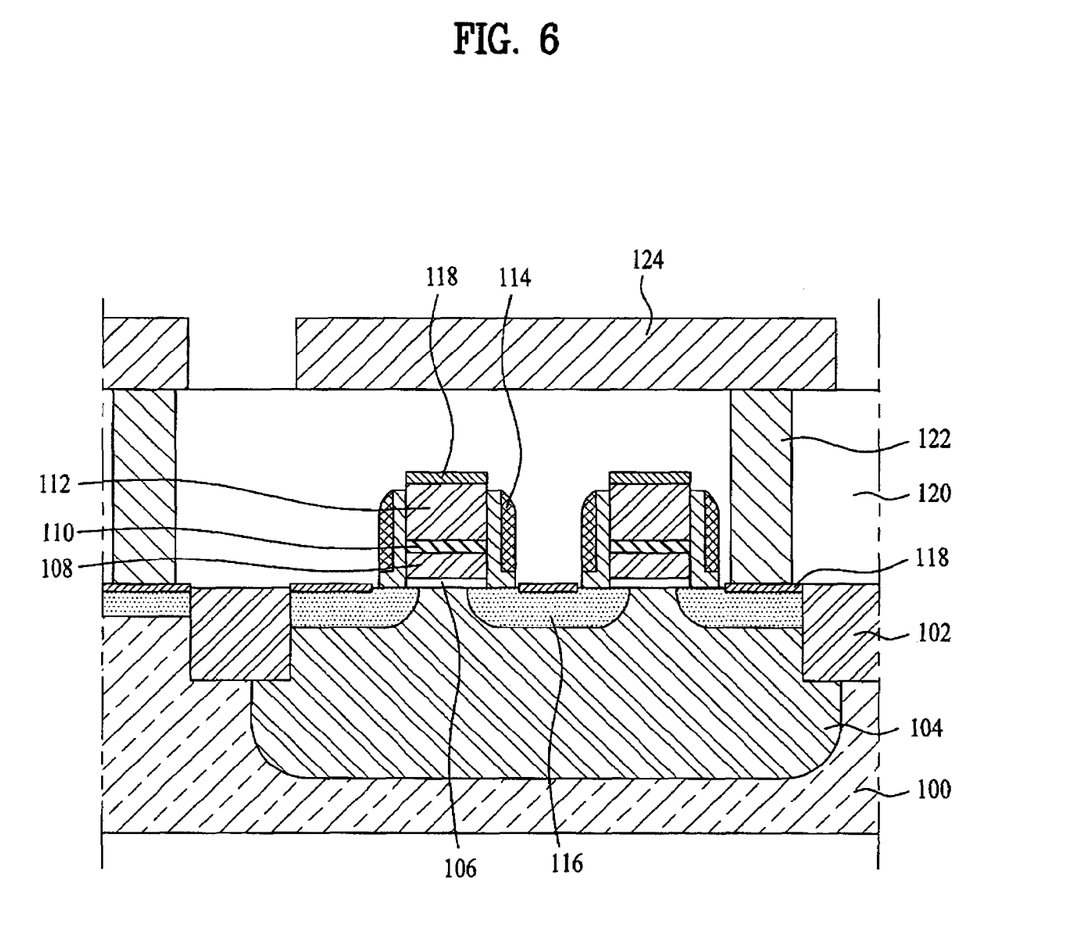
FIG. 6 is a cross sectional view of illustrating a cell transistor in a flash memory according to the present invention.

FIG. 6 is a cross sectional view of illustrating a cell transistor in a flash memory according to the present invention. Referring to FIG. 6, a cell transistor of a flash memory according to the present invention is comprised of a semiconductor substrate 100, a device isolation film of STI structure 102, a tunnel oxide layer 106, a floating gate 108, a gate insulating layer 110, a control gate 112, and source and drain regions 116.

At this time, the semiconductor substrate 100 is formed of a silicon substrate, and the device isolation film 102 is formed on the semiconductor substrate 100. Then, the tunnel oxide layer 106, the floating gate 108, the gate insulating layer 110 and the control gate 112 are sequentially stacked on the semiconductor substrate 100 in correspondence with the predetermined portion between the device isolation films 102. Also, the source and drain regions 116 are formed in the semiconductor substrate 100 at both sides of the floating gate 108. After that, an insulating interlayer 120 is formed on an entire surface of the cell transistor. In addition, a contact electrode 122 and a line 124 are connected with the source and drain regions 116 through a contact hole of the insulating interlayer 120.

Next, a well 104 is formed in the semiconductor substrate 100 between the device isolation films 102. Then, spacers 114 are formed at the sidewalls of the control gate 112 and the tunnel oxide layer 116, wherein the spacers are formed of an insulating material. Also, a metal silicide layer 118 of tungsten silicide WSi is formed on the control gate 112 and the source and drain regions 116.

In the method for fabricating the cell transistor of the flash memory according to the present invention, it is possible to remove the mouse bite generated when forming the device isolation film 102 of STI structure in the cell transistor. Thus, the etching residue is removed from the floating gate 108 and the control gate 112.

Figure 7:
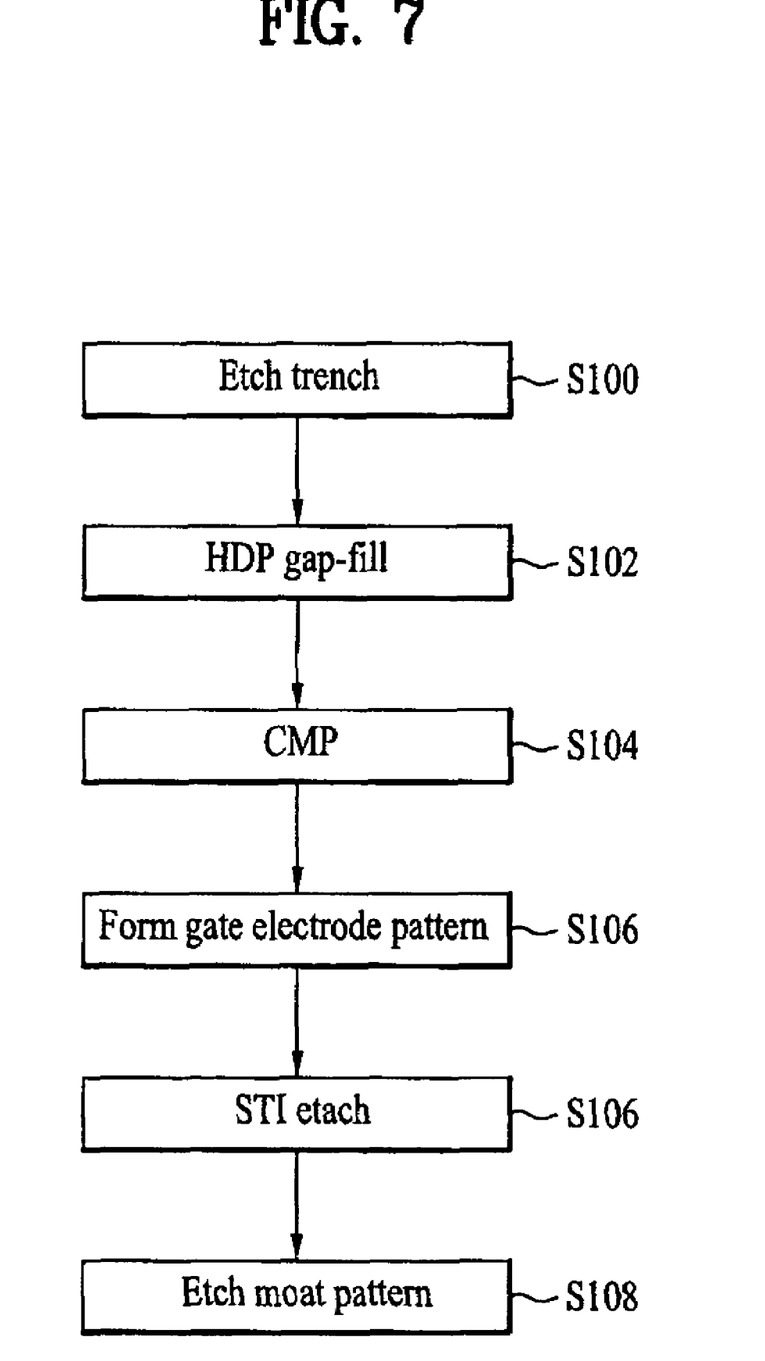
FIG. 7 is a flow chart of illustrating the process for fabricating a device isolation film and a gate in a cell transistor of a flash memory according to the present invention.

FIG. 7 is a flow chart of illustrating the process for fabricating the device isolation film and the gate in the cell transistor of the flash memory according to the present invention. FIG. 8A to FIG. 8E are cross sectional views of the process for fabricating the device isolation film and the gates in the cell transistor of the flash memory according to the present invention.

The device isolation film of STI structure and the gates in the cell transistor of the flash memory according to the present invention are fabricated in the following process.

Figure 8A:
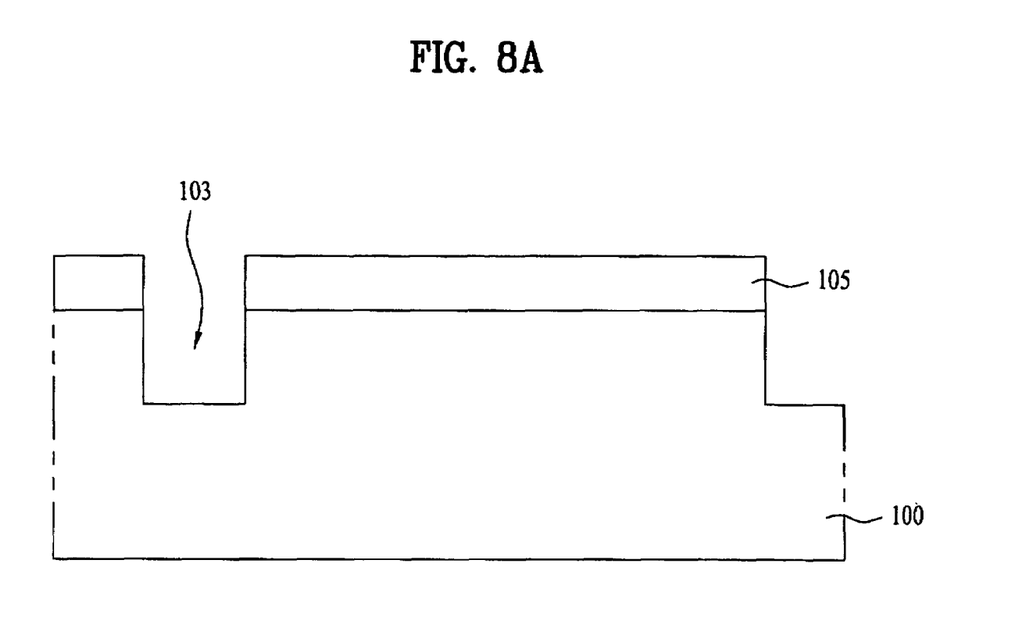
FIG. 8A to FIG. 8E are cross sectional views of the process for fabricating the device isolation film and the gates in the cell transistor of the flash memory according to the present invention.

Referring to FIG. 8A, an STI moat pattern 105 for defining the device isolation film 102 of STI structure is formed in the semiconductor substrate 100 of silicon. Then, the semiconductor substrate 100 exposed by the STI moat pattern 105 is dry-etched at the predetermined depth, for example, at a thickness of 3000 Å, thereby forming a shallow trench 103 (S100). At this time, the moat pattern 105 is formed of a silicon nitride layer $Si_3N_4$. In addition, a silicon oxide layer $SiO_2$ may be additionally formed below the STI moat pattern 105, wherein the silicon oxide layer functions as a pad.

Figure 8B:
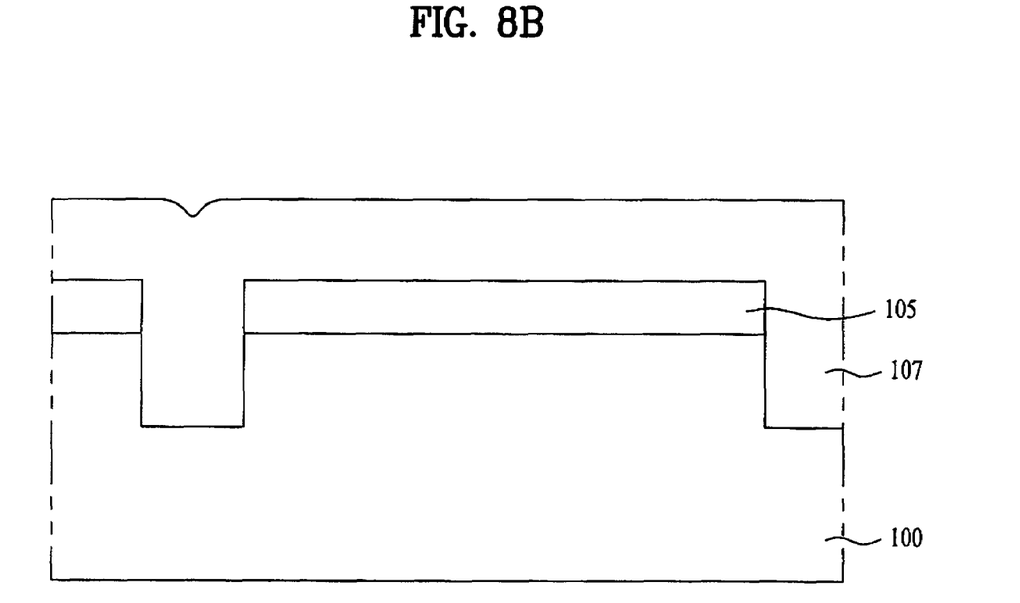

Referring to FIG. 8B, the shallow trench 103 is gap-filled by HDP (High Density Plasma) process (S102), whereby the shallow trench 103 is filled with an insulating layer 107 such as silicon oxide $SiO_2$ or TEOS (Tetraethylorthosilicate).

Figure 8C:
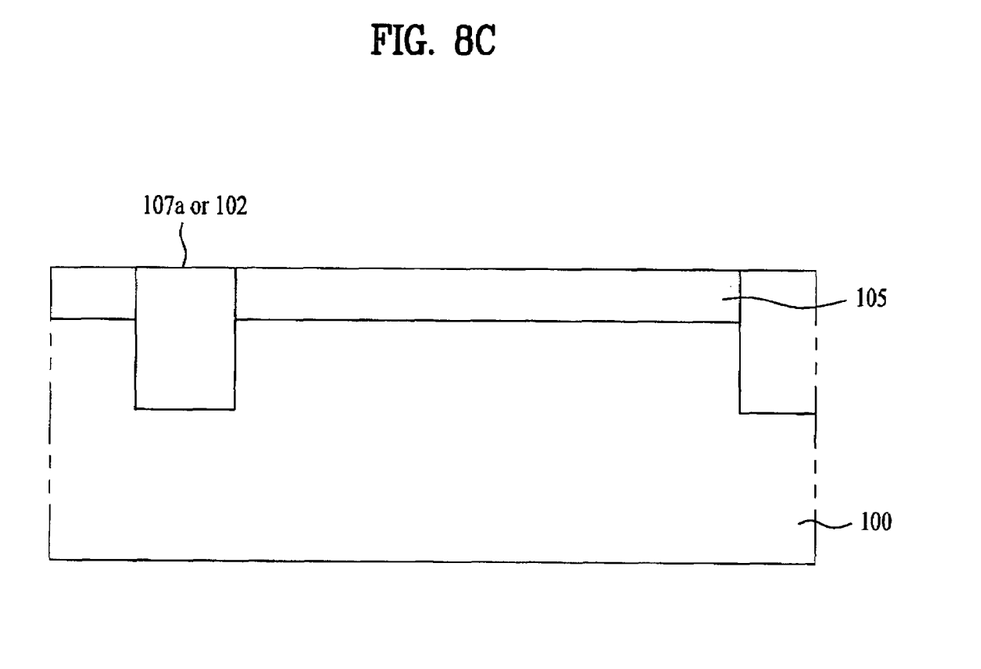

Referring to FIG. 8C, the gap-fill insulating layer 107 is etched by CMP (Chemical Mechanical Polishing) when exposing the STI moat pattern 105, thereby forming the device isolation film 102 of STI structure in the shallow trench by planarizing the surface of the insulating layer.

In the method for fabricating the cell transistor of the flash memory according to the present invention, the STI moat pattern 105 is not removed after performing the CMP process to the device isolation film 102. Instead, a flash memory cell transistor area is opened in the semiconductor substrate, and a flash cell pattern (not shown) is formed for masking a periphery circuit portion of the semiconductor substrate except the flash memory cell transistor area (S106). For example, the flash cell pattern is formed of photoresist.

Figure 8D:
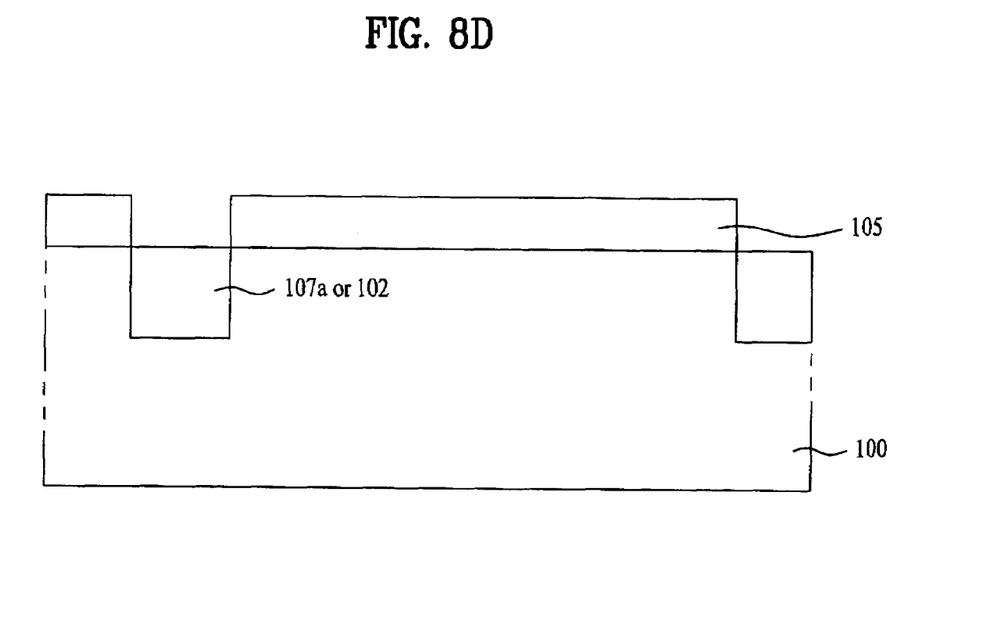

Referring to FIG. 8D, the upper surface of the device isolation layer 102 in the semiconductor substrate opened by the flash cell pattern is wet-etched at a constant thickness, for example, 200 Å to 300 Å (S108). At this time, the etching process uses an etchant of HF solution.

According as the upper surface of the device isolation layer 102 is etched at a thickness of 200 Å to 300 Å by the wet-etching process of using HF solution, it is possible to prevent the mouse bite generated in the upper edge of the shallow trench on the HDP gap-filling process. In case of the related art etching of HDP, the upper edge of the device isolation film 102 may be formed of the negative sloping surface due to the mouse bite generated in the upper edge of the shallow trench. In the present invention, the upper surface of the device isolation layer having the negative sloping surface is removed by the wet-etching process of using HF, thereby preventing the mouse bite in the upper edge of the shallow trench.

Figure 8E:
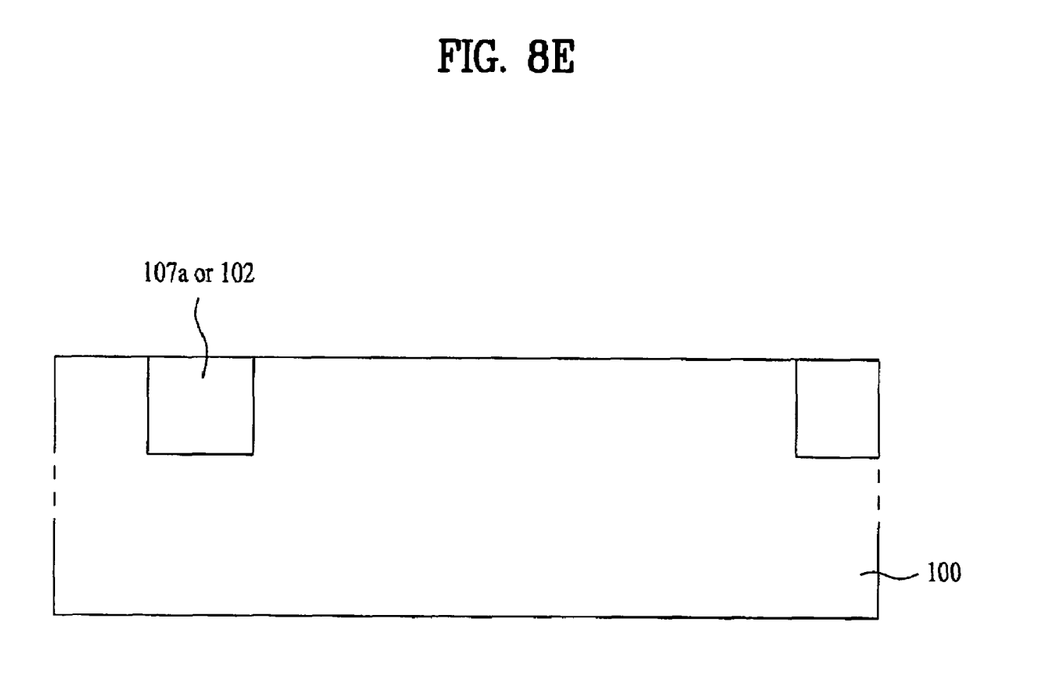

Referring to FIG. 8E, the flash cell pattern used for forming the device isolation film is removed by ashing, and then the STI moat pattern 105 is also removed with phosphoric acid $H_3PO_4$ (S110).

Next, the tunnel oxide layer 106 is formed on the semiconductor substrate 100 in correspondence with the predetermined portion between the device isolation films 102. Thereon, after forming a conductive layer for the floating gate, for example, doped polysilicon, the gate insulating layer of ONO (oxide-nitride-oxide) is formed, and then a conductor layer for the control gate, for example, doped polysilicon, is formed in sequence. Then, the gate electrode of the cell transistor in the flash memory is patterned in a dry-etching method of using a gate mask. That is, the control gate 112 is formed by patterning the upper doped polysilicon, and the gate insulating layer 110 is patterned under the control gate 112. Then, the floating gate 108 is formed by patterning the lower doped polysilicon.

On patterning the gate electrode, the polysilicon etching residue of the control gate 112 and the floating gate 108 are not formed on the upper surface of the device isolation layer 102 etched at the predetermined thickness.

Figure 9:
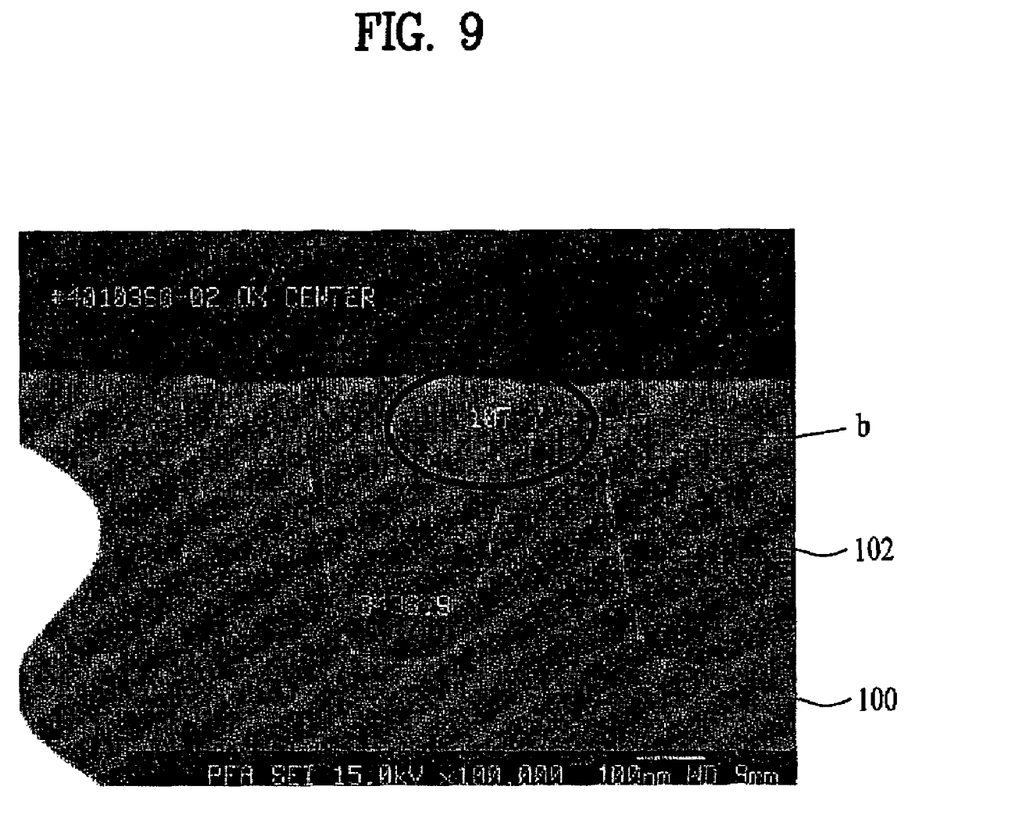
FIG. 9 illustrates a cell transistor from which the etching residue is removed, fabricated in a method according to the present invention.

FIG. 9 illustrates the cell transistor from which the etching residue is removed, fabricated in the method according to the present invention.

Referring to FIG. 9, after patterning the gate electrode, the upper surface of the device isolation film 102 is etched at the predetermined thickness of 200 Å to 300 Å. That is, as shown in "b" of FIG. 9, the polysilicion etching residue of the gate electrode is not formed on the upper surface of the device isolation film 102.

As mentioned above, the method for fabricating the cell transistor of the flash memory according to the present invention has the following advantages.

After performing the CMP process to the gap-fill insulating layer, the gate electrode deposition and patterning process is performed. Then, the device isolation film of STI structure is etched at the constant thickness, so that it is possible to prevent the mouse bite generated in the process of HDP. As a result, the etching residue of the gate electrode is not formed on the upper surface of the device isolation film by preventing the mouse bite, thereby improving the yield in fabricating the flash memory according to the present invention.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A method for fabricating a, transistor comprising:
   forming a moat pattern on a scmiconductor substrate;
   forming a shallow trench by etching the semiconductor substrate exposed by the moat pattern, using the moat pattern as a mask;
   forming a gap-fill insulating layer in the shallow trench and on the moat pattern by HDP;
   forming a device isolation film in the shallow trench by polishing the gap-fill insulating layer;
   forming a cell pattern for masking a periphery circuit portion of the semiconductor substrate, opening a transitor area of the semiconductor substrate, and exposing the device isolation film in the transistor area;
   etching an upper surface of the device isolation film in the transistor area; and
   removing the cell pattern and the moat pattern after etching the upper surface of the device isolation film.

2. The method of claim 1, wherein etching the upper surface of the device isolation film comprises wet-etching using an HF solution.

3. The method of claim 1, wherein the upper surface of the device isolation layer is etched at a thickness of 200 Å to 300 Å.

4. The method of claim 1, wherein the moat pattern comprises a silicon nitride layer.

5. The method of claim 1, further comprising forming a silicon oxide layer below the moat pattern.

6. The method of claim 1, wherein the gap-fill insulating layer comprises silicon oxide or a tetraethylorthosilicate (TEOS) based insulating layer.

7. The method of claim 1, wherein the cell pattern comprises a photoresist and opens the transistor area.

8. The method of claim 7, wherein the cell pattern is removed by ashing.

9. The method of claim 1, wherein the moat pattern is removed with phosphoric acid.

10. The method of claim 1, further comprising sequentially forming a tunnel oxide layer, a first conductive layer, a gate insulating layer, and a second conductive layer on the semiconductor substrate after removing the cell pattern and the moat pattern.

11. The method of claim 10, further comprising forming a gate electrode for a flash memory transistor by etching the second conductive layer, the gate insulating layer, the first conductive layer, and the tunnel oxide layer.

12. The method of claim 10, wherein the first and second conductive layers comprise doped polysilicon and the device isolation film comprises a shallow trench isolation (STI) structure.

13. The method of claim 10, wherein the gate insulating layer comprises a oxide-nitride-oxide (ONO) layer.

14. The method of claim 11, further comprising forming a source region and a drain region at opposite sides of the gate electrode.

15. The method of claim 14, further comprising forming an insulating layer on the entire surface of the substrate after forming the source region and the drain region.

16. The method of claim 15, further comprising forming a contact hole through the insulating layer to the source region or drain region, forming a contact electrode filling the contact hole, and forming a line on the insulating layer connecting to the contact electrode.

17. The method of claim 14, further comprising forming a metal silicide layer on the gate electrode, the source region, and the drain region.

18. The method of claim 14, further comprising forming spacers at the sidewalls of the gate electrode.

19. The method of claim 17, wherein the metal silicide layer comprises tungsten silicide.

20. The method of claim 1, further comprising forming a well in the semiconductor substrate.

* * * * *